(12) United States Patent
Lim

(10) Patent No.: US 7,154,311 B2
(45) Date of Patent: Dec. 26, 2006

(54) DELAY LOCKED LOOP IN SEMICONDUCTOR MEMORY DEVICE AND LOCKING METHOD THEREOF

(75) Inventor: Min-Su Lim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 51 days.

(21) Appl. No.: 11/017,644

(22) Filed: Dec. 22, 2004

(65) Prior Publication Data

US 2005/0140408 A1 Jun. 30, 2005

(30) Foreign Application Priority Data

Dec. 29, 2003 (KR) ............... 10-2003-0098511

(51) Int. Cl.
*H03L 7/06* (2006.01)
(52) U.S. Cl. .................... 327/156; 327/158
(58) Field of Classification Search ............ 327/115, 327/117, 149, 153, 156, 158, 161; 365/194; 375/376; 377/47, 48
See application file for complete search history.

(56) References Cited

U.S. PATENT DOCUMENTS

| 6,066,968 A | 5/2000 | Yang ............... 327/156 |
| 6,100,736 A | 8/2000 | Wu et al. ........... 327/159 |
| 6,621,496 B1 | 9/2003 | Ryan ............... 345/533 |

FOREIGN PATENT DOCUMENTS

| JP | 05243975 A | * 9/1993 |
| JP | 2001-283589 | 10/2001 |

* cited by examiner

*Primary Examiner*—Linh My Nguyen
(74) *Attorney, Agent, or Firm*—Mayer, Brown, Rowe & Maw LLP

(57) ABSTRACT

Provided is a delay locked loop (DLL) adapted for high-speed operation of a semiconductor memory device. The delay locked loop (DLL) includes: a clock buffer; a plurality of clock dividers; and a controller for activating an enable signal at a falling edge of a control clock by using a reset bar signal and a control clock outputted from the clock buffer.

16 Claims, 7 Drawing Sheets

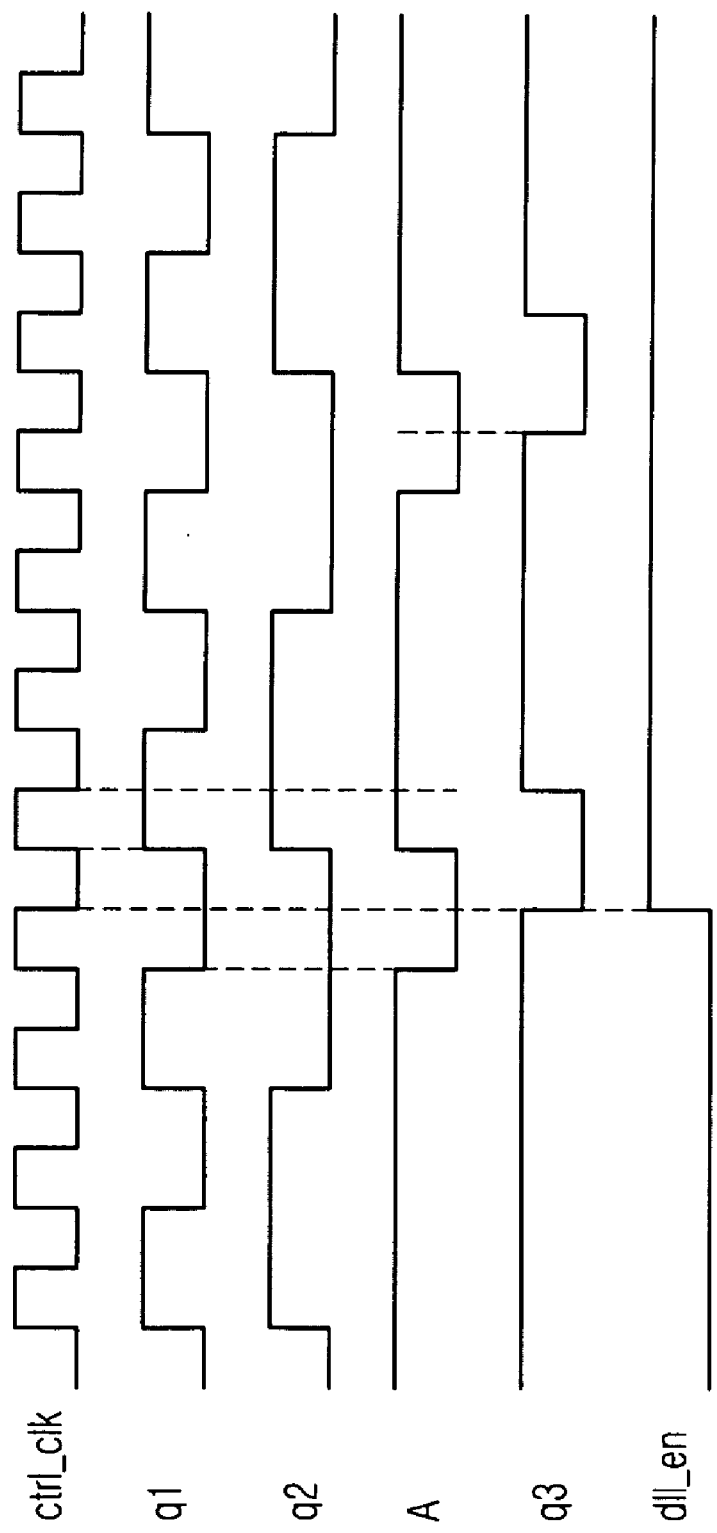

DELAY LOCKED LOOP IN SEMICONDUCTOR MEMORY DEVICE AND LOCKING METHOD THEREOF

FIELD OF INVENTION

The present invention relates to a semiconductor memory device; and, more particularly, to a delay locked loop (DLL) of a semiconductor memory device adapted for high-speed operation.

DESCRIPTION OF PRIOR ART

In systems or circuits, a clock is used as a reference for adjusting an operational timing and is also used for securing high-speed and error-free operation in the system or the circuit. When an external clock is used for an internal circuit, a delay time between the external clock and an internal clock inevitably occurs due to the internal circuit. The delay time is called a clock skew. Therefore, in order to compensate for the delay time and make the internal clock have the same phase as that of the external clock, a delay locked loop (hereinafter, referred to as a DLL) is typically used in the semiconductor memory device. That is, the DLL synchronizes the external clock with an internal clock.

FIG. 1 is a block diagram of a prior art DLL for use in a double data rate (DDR) synchronous DRAM (SDRAM).

Referring to FIG. 1, the prior art DLL includes a first clock buffer 111, a second clock buffer 112, a delay line 113, a first clock divider 114, a phase comparator 115, a shift controller 116, a second clock divider 117, a delay model 118, a first DLL driver 119, a second DLL driver 120 and a DLL controller 121.

The first clock buffer 111 buffers an external clock bar signal /clk and an external clock signal clk and generates a first internal clock signal fall_clk in synchronization with a falling edge of the external clock signal clk.

The second clock buffer 112 buffers the external clock bar signal /clk and the external clock signal clk and generates a second internal clock signal rise_clk in synchronization with a rising edge of the external clock signal clk.

The first clock divider 114 receives a control signal ctrl_clk from the second clock buffer 112 and generates a first clock dvd_clk_a and a second clock dvd_clk_b in response to an enable signal DLL_en. The second clock dvd_clk_b is produced by dividing the control signal ctrl_clk by 1/n, where n is a positive integer.

The second clock divider 117 receives the first clock dvd_clk_a from the delay line 113 and outputs a clock feedback_dly, which is divided by 1/n (where n is a positive integer), in response to an enable signal DLL_en.

The delay model 118 is configured to receive the clock feedback_dly from the second clock divider 117 and make the clock feedback_dly pass through the same delay condition as that of the actual clock path.

The phase comparator 115 compares a phase of a rising edge of a feedback clock feedback outputted from the delay model 118 with a phase of a rising edge of the second clock dvd_clk_b.

The shift controller 116 controls a delay amount at the delay line 113 by shifting a clock phase of the delay line 113 in response to control signals ctrl outputted from the phase comparator 115.

The first DLL driver 119 drives a first output signal ifclk of the delay line 113 to generate a first DLL clock fclk_dll.

The second DLL driver 121 generates a second DLL clock rclk_dll by driving a second output signal irclk of the delay line 113.

The DLL controller 121 receives a control clock ctrl_clk, a DLL diable signal dis_DLL, a DLL reset signal dll_reset, a power-up signal pwrup and a self refresh signal srefd and outputs an enable signal DLL_en for enabling the DLL.

However, if the enable signal DLL_en generated from the DLL controller 121 of FIG. 2 is applied to the first clock divider 114, a short pulse may be generated when the first clock dvd_clk_a is initially toggled as shown in FIG. 3. The problem due to generation of the short pulse is that the operation of the clock dividers 114 and 117 dose not be performed simultaneously. In other words, although the enable signal DLL_en is commonly used for the first and the second clock dividers 114 and 117, an input timing of the enable signal DLL_en into the first clock divider 114 may be a little different from an input timing of the enable signal DLL_en into the second clock divider 117 owing to various factors, e.g., a routing skew. Therefore, the rising edge of the short pulse is counted as logic high level so that the first clock divider 114 performs the division operation at the short pulse. Meanwhile, in the second clock divider 117, the division operation is performed at a rising edge of a second pulse after the short pulse. As a result, there may be a fail that the second clock pulse dvd_clk_b of logic low level is not coincident with the feedback clock pulse feedback of logic low level, as shown in FIG. 4.

Moreover, if the width of the short pulse is extremely narrow, the short pulse may disappear while passing through the delay line 113. In this case, while the first clock divider 114 recognizes the rising edge of the short pulse, the second clock divider 117 does not recognize the short pulse at all because the narrow short pulse has already disappeared. Accordingly, there may be the fail that the second clock pulse dvd_clk_b of logic low level is not coincident with the feedback clock pulse feedback of logic low level.

SUMMARY OF INVENTION

It is, therefore, an object of the present invention to provide a delay locked loop (DLL) of the semiconductor memory device adapted for high-speed operation by employing a plurality of flip-flops therein.

In accordance with an aspect of the present invention, there is provided a delay locked loop (DLL) including: a clock buffer; a plurality of clock dividers; and a DLL controller for activating a DLL enable signal at a falling edge of a control clock based on a reset bar signal and the control clock outputted from the clock buffer.

In accordance with another aspect of the present invention, there is provided a locking method of a DLL having a clock buffer and a plurality of clock dividers. The locking method includes the steps of: activating an enable signal at a falling edge of a control clock outputted from the clock buffer by using a reset bar signal and the control clock; and performing a logic operation on an enable signal outputted from a controller and the control clock signal at one of the plurality of clock dividers.

BRIEF DESCRIPTION OF THE DRAWINGS

The above and other objects and features of the present invention will become apparent from the following description of preferred embodiments taken in conjunction with the accompanying drawings, in which:

FIG. 7 is a timing diagram of each components contained in the DLL controller in accordance with the preferred embodiment of the present invention.

DETAILED DESCRIPTION OF INVENTION

Hereinafter, a delay locked loop (DLL) for use in a semiconductor device in accordance with the present invention will be described in detail referring to the accompanying drawings.

Figure 1:
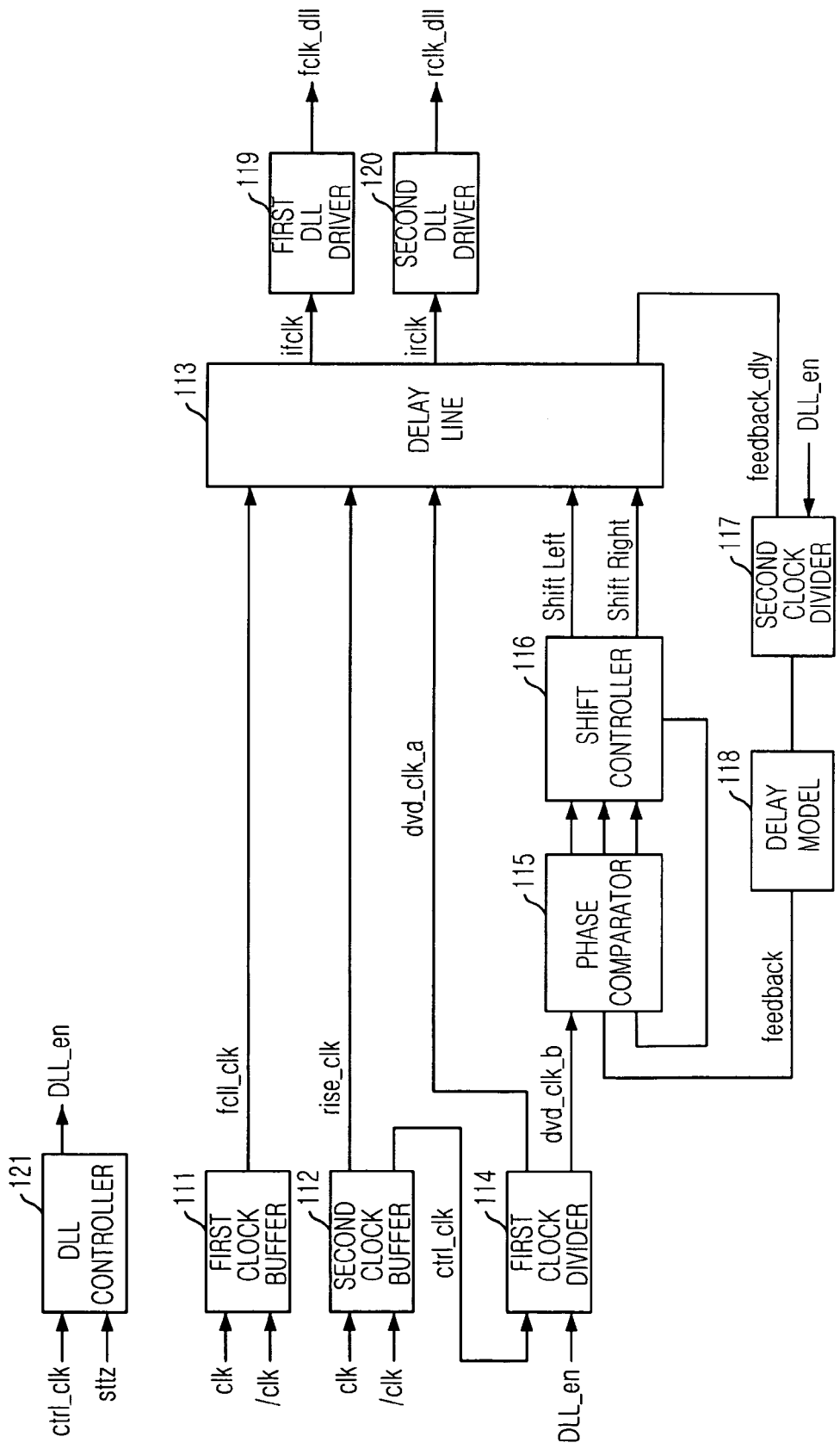
FIG. 1 is a block diagram of a prior art delay locked loop (DLL) of a semiconductor memory device.
Figure 2:
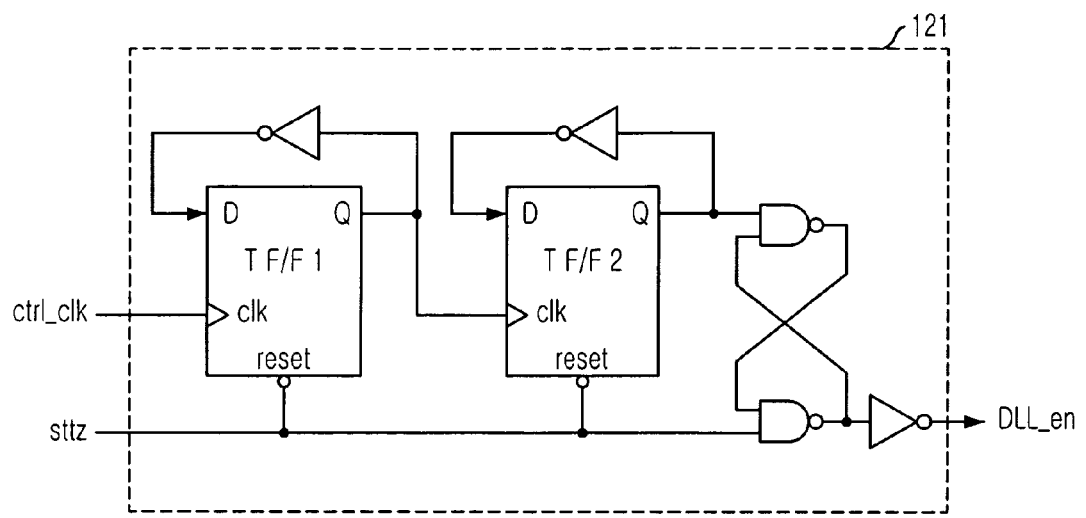
FIG. 2 is a circuit diagram of a DLL controller for use in the prior art DLL.
Figure 3:
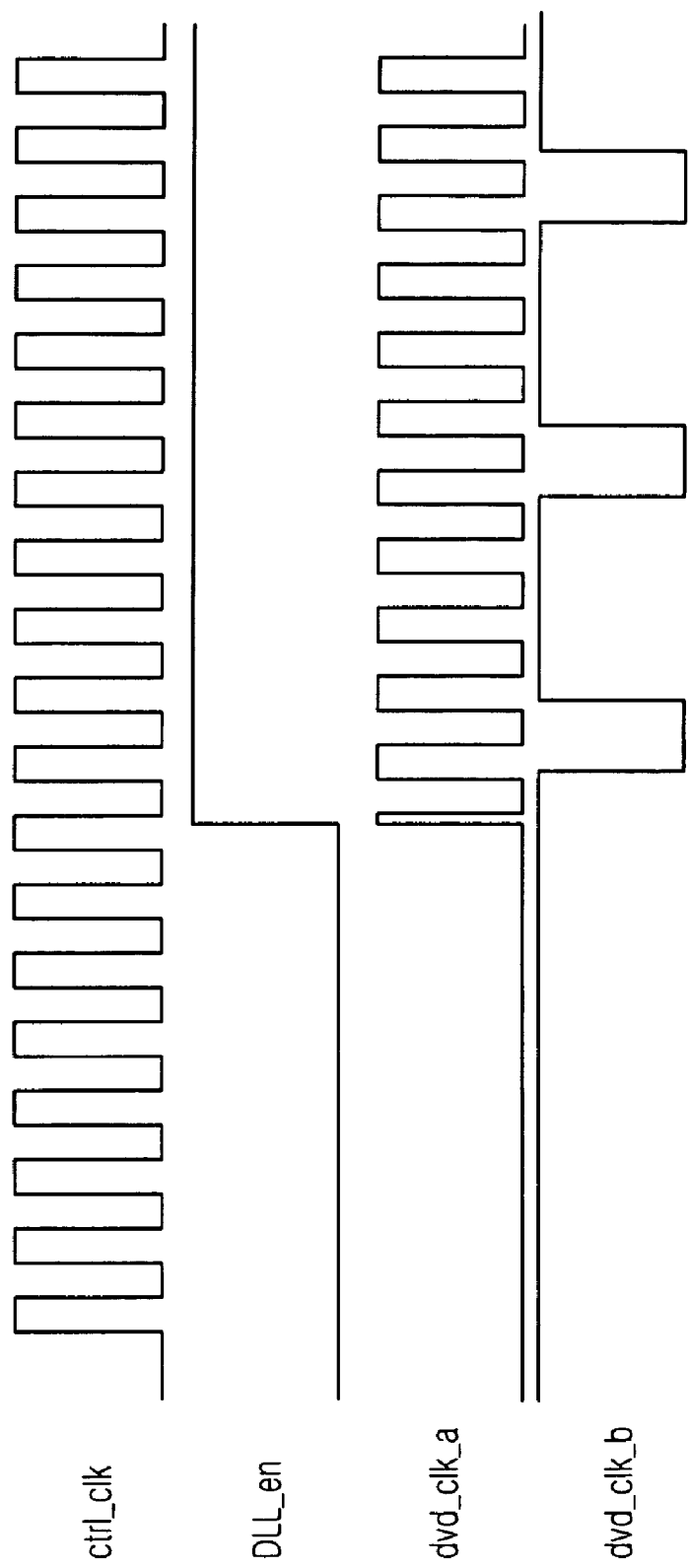
FIG. 3 is a timing diagram of a first clock divider for use in the prior art DLL.
Figure 4:
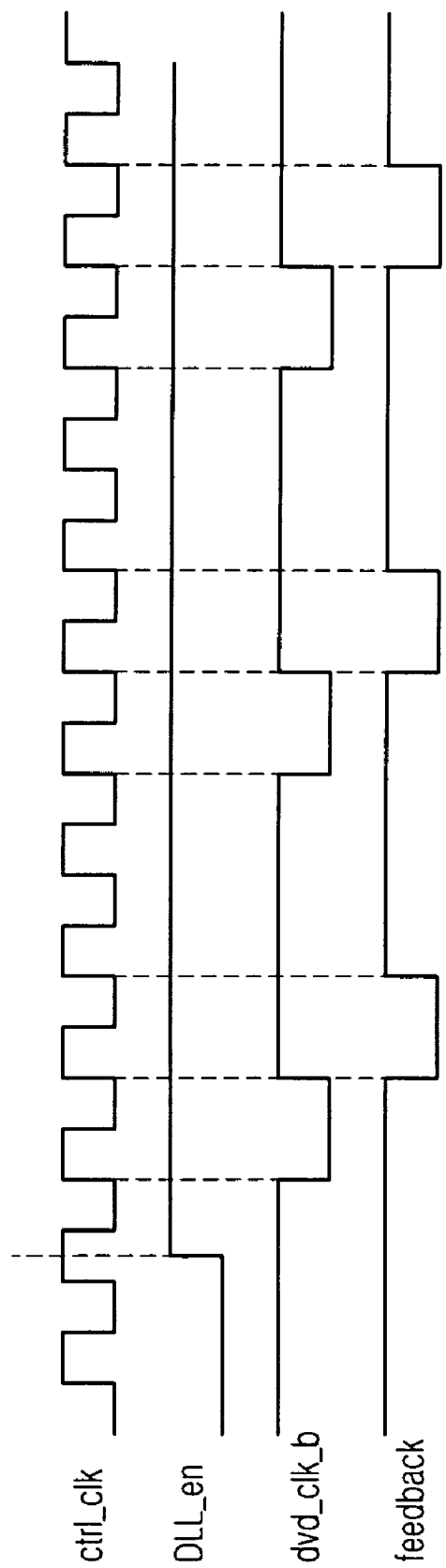
FIG. 4 is a timing diagram showing a mismatched timing between the output signal of the first clock divider and the output signal of the second clock divider.
Figure 5:
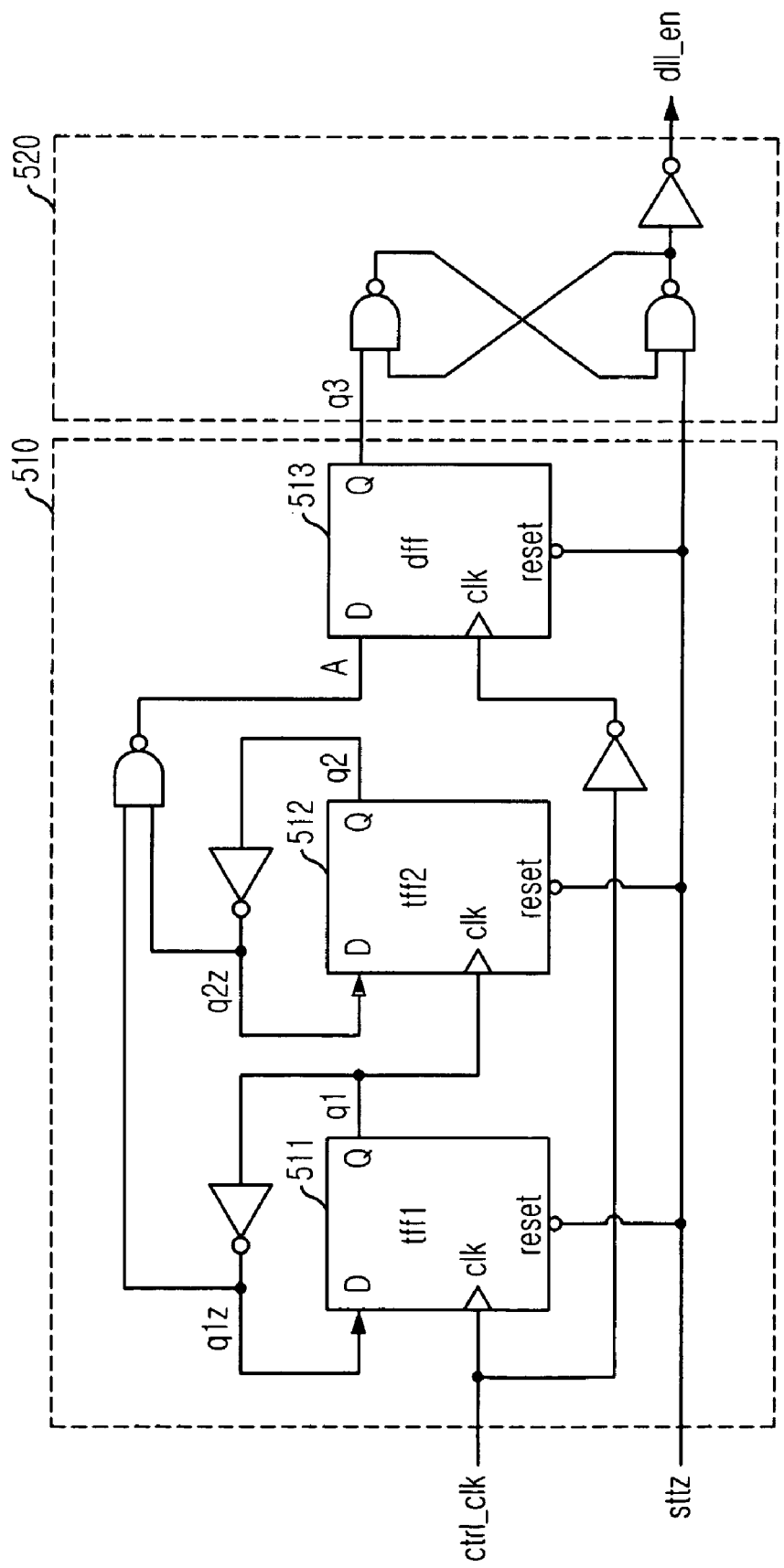
FIG. 5 is a block diagram of a DLL controller in accordance with a preferred embodiment of the present invention.

FIG. 5 is a block diagram of a DLL controller in accordance with a preferred embodiment of the present invention. The DLL controller includes a plurality of T flip-flop blocks 511 and 512, a D flip-flop 513 and a latch unit 520. The plurality T flip-flops 511 and 512 activate an enable signal dll_en at a falling edge of a control clock signal ctr_clk inputted from a second clock buffer (not shown) by using the control clock signal ctr_clk and a reset bar signal sttz. Herein, the reset bar signal is used for resetting the DLL controller.

In detail, a first T flip-flop 511 receives the control signal ctrl_clk as a clock and changes its state whenever a clock pulse of the control signal ctrl_clk is inputted. That is, as shown in FIG. 7, the first T flip-flop 511 divides the control clock by two.

A second T flip-flop 512 uses the output signal of the first T flip-flop 511 as a clock and divides the output signal of the first T flip-flop 511 by two.

The D flip-flop 513 receives a signal that maintains a logic low level while both the output signals of the first and second T flip-flops are logic low levels, and it uses an inverted control signal ctrl_clk as a clock. Thus, the D flip-flop 513 outputs a predetermined signal of logic low level for one clock at the falling edge of the control clock ctr_clk.

The latch unit 520 receives the output signal of the D flip-flop 513 and the reset bar signal sttz and outputs an enable signal of logic high level in response to the falling edge of an initial clock signal outputted from the D flip-flop 513.

Meanwhile, although two T flip-flops are used to divide the clock signal by four, one T flip-flop may be used to divide the clock signal by two, or three flip-flops may be used to divide the clock signal by eight.

Figure 6:
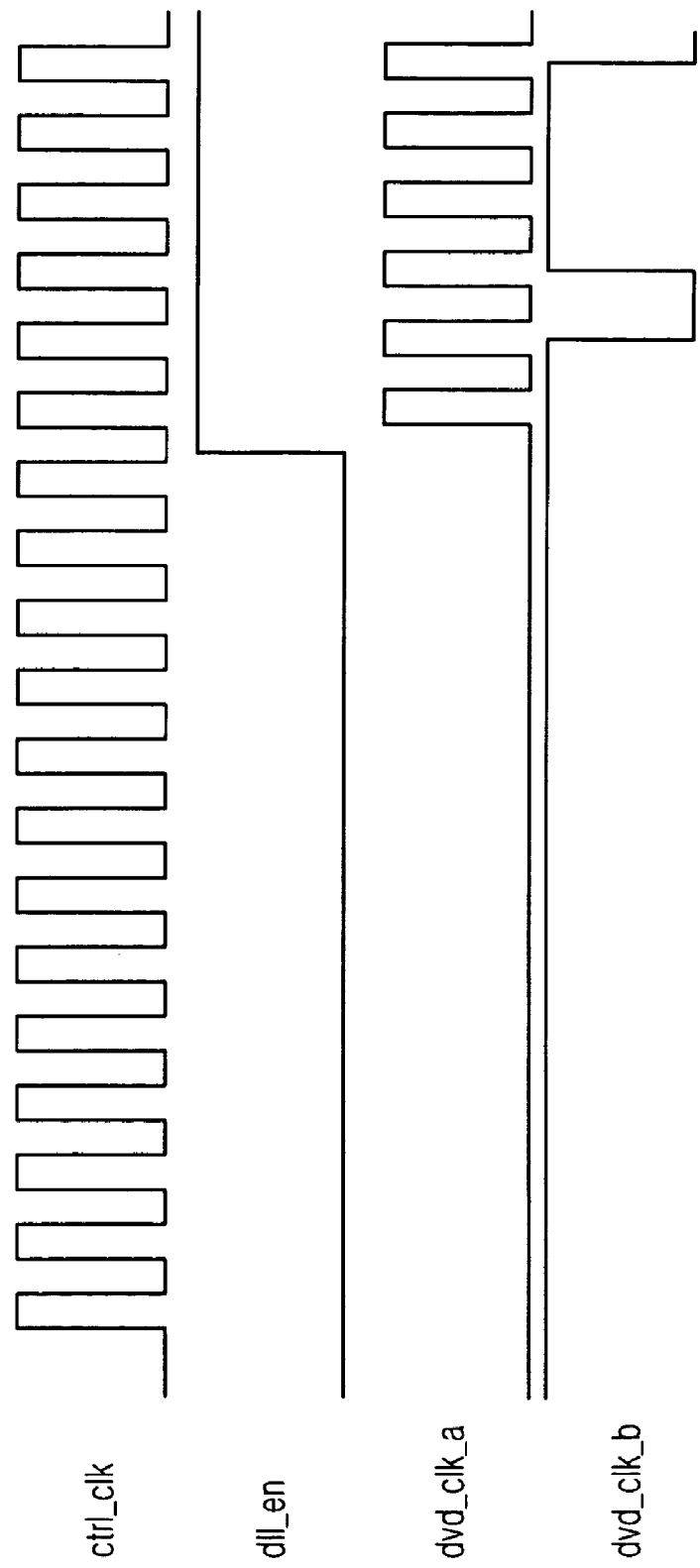
FIG. 6 is a timing diagram of a first clock divider in accordance with the preferred embodiment of the present invention.

FIG. 6 is a timing diagram of the first clock divider in accordance with the preferred embodiment of the present invention, and FIG. 7 is a timing diagram of each components contained in the DLL controller in accordance with the preferred embodiment of the present invention.

Referring to FIG. 6, since the enable signal dll_en is activated at the logic low level of the control clock signal ctr_clk, the initial clock can be normally outputted from the first and second clock dividers 114 and 117 using the enable signal dll_en. As a result, it is possible to minimize a fail when the DLL performs a locking operation.

The present application contains subject matter related to Korean patent application No. 2003-98511, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) having a clock buffer and a plurality of clock dividers, comprising:
    a DLL controller for controlling a DLL enable signal transiting to an enabled state at a falling edge of a control clock based on a reset bar signal and the control clock outputted from the clock buffer, wherein the DLL controller includes:
    a first T flip-flop configured to divide the control clock by two;
    a second T flip-flop configured to divide an output of the first flip-flop by two;
    a D flip-flop configured to receive a signal maintaining a first logic level while both the outputs of the first and second T flip-flops have the first logic level; and
    a latch unit configured to receive an output of the D flip-flop and the reset bar signal and to output the DLL enable signal having the enabled state.

2. The DLL as recited in claim 1, wherein the D flip-flop uses an inverted control clock as its clock and the output of the D flip-flop has the first logic level for one clock at the falling edge of the control clock.

3. A delay locked loop (DLL) having a clock buffer and a plurality of dividers, comprising a DLL controller including:
    a first T flip-flop configured to divide a control clock by two;
    a second T flip-flop configured to divide an output of the first T flip-flop by two;
    a third T flip-flop configured to divide an output of the second T flip-flop by two;
    a D flip-flop configured to receive a signal maintaining a first logic level while all of the outputs of the first to third T flip-flops have the first logic levels and to use an inverted control clock as its clock, wherein an output of the D flip-flop has the first logic level for one clock at a falling edge of the control clock; and
    a latch unit configured to receive the output of the D flip-flop and a reset bar signal output from the clock buffer and to output a DLL enable signal transiting to an enabled state at the falling edge of the control clock.

4. The DLL as recited in claim 2, wherein the first T flip-flop uses the control clock as its clock, receives an inverted output of the first T flip-flop as an input, and uses the reset bar signal as a clear signal.

5. The DLL as recited in claim 3, wherein the first T flip-flop uses the control clock as its clock receives an inverted output of the first T flip-flop as an input, and uses the reset bar signal as a clear signal.

6. The DLL as recited in claim 2, wherein the second T flip-flop uses the output of the first T flip-flop as its clock, receives an inverted output of the second T flip-flop as an input, and uses the reset bar signal as a clear signal.

7. The DLL as recited in claim 3, wherein the second T flip-flop uses the output of the first T flip-flop as its clock, receives an inverted output of the second T flip-flop as an input, and uses the reset bar signal as a clear signal.

8. The DLL as recited in claim 3, wherein the third T flip-flop uses the output of the second flip-flop as its clock signal, receives an inverted output of the third flip-flop as an input, and uses the reset bar signal as a clear signal.

9. The DLL as recited in claim 2, wherein the D flip-flop uses the reset bar signal as a clear signal and the signal input to the D flip-flop generated by logically combines the outputs of the first and the second T flip-flops.

10. The DLL as recited in claim 3, wherein the D flip-flop uses the reset bar signal as a clear signal and the signal input to the D flip-flop generated by logically combines the outputs of the first to third T flip-flops.

11. The DLL as recited in claim 2, wherein the latch unit includes:
   a first NAND gate and a second NAND gate, wherein the first NAND gate logically combines the output of the D flip-flop and output of the second NAND gate, and the second NAND gate logically combines the reset bar signal and an output signal of the first NAND gate; and
   an inverter for inverting the output signal of the second NAND gate.

12. The DLL as recited in claim 3, wherein the latch unit includes:
   a first NAND gate and a second NAND gate, wherein the first NAND gate logically combines the output of the D flip-flop and an output of the second NAND gate, and the second NAND gate logically combines the reset bar signal and an output of the first NAND gate; and
   an inverter for inverting the output signal of the second NAND gate.

13. The DLL as recited in claim 2, wherein one of the plurality of clock dividers generates a divided clock based on the DLL enable signal and the control clock.

14. The DLL as recited in claim 2, wherein one of the plurality of clock dividers generates a divided clock based on the control clock.

15. A method for controlling an operation of a delay locked loop (DLL) comprising the steps of:
   a) generating a DLL enable signal transiting to an enabled state at a falling edge of a control clock by using a reset bar signal and the control clock; and
   b) generating a divided clock based on the control clock, wherein the step of a) includes the steps of:
      a1) first dividing the control clock by two;
      a2) second dividing the first divided control clock by two;
      a3) receiving a signal maintaining a first logic level while both of the first and the second divided control clocks have the first logic level, and outputting a predetermined signal having the first logic level for one clock at the falling edge of the control clock; and
      a4) receiving the predetermined signal and the reset bar signal and outputting the DLL enable signal having an enabled state.

16. A delay locked loop (DLL), comprising:
   a DLL controller for controlling a DLL enable signal transiting to an enabled state at a falling edge of a control clock based on a reset bar signal, wherein the DLL controller includes:
      a first clock divider for dividing the control clock by two;
      a second clock divider for dividing an output of the first clock divider by two;
      a flip-flop for receiving a signal maintaining a first logic level while both of the outputs of the first and the second clock dividers have the first logic level and outputting a predetermined signal having the first logic level for one clock at the falling edge of the control clock; and
      a latch unit for receiving an output of the flip-flop and the reset bar signal and outputting the DLL enable signal.

\* \* \* \* \*